United States Patent [19]
Mukherjee et al.

[11] Patent Number: 5,268,586
[45] Date of Patent: Dec. 7, 1993

[54] VERTICAL POWER MOS DEVICE WITH INCREASED RUGGEDNESS AND METHOD OF FABRICATION

[75] Inventors: Satyendranath Mukherjee, Yorktown Heights; Manjin J. Kim, Ossining, both of N.Y.

[73] Assignee: North American Philips Corporation, New York, N.Y.

[21] Appl. No.: 842,853

[22] Filed: Feb. 25, 1992

[51] Int. Cl.$^5$ .............................................. H01L 29/10
[52] U.S. Cl. .................................. 257/335; 257/339; 257/341
[58] Field of Search ............... 357/23.4; 257/335, 339, 257/341, 342, 139, 144

[56] References Cited

U.S. PATENT DOCUMENTS

| | | |
|---|---|---|
| 4,587,713 | 5/1986 | Goodman et al. |
| 4,680,604 | 7/1987 | Nakagawa et al. |
| 4,774,198 | 9/1988 | Contiero et al. |
| 4,809,047 | 2/1989 | Temple |

FOREIGN PATENT DOCUMENTS

| | | | |
|---|---|---|---|
| 0336393 | 10/1989 | European Pat. Off. | |
| 58-175872 | 10/1983 | Japan | 357/23.4 |
| 61-156882 | 7/1986 | Japan | 357/23.4 |
| 62-291179 | 12/1987 | Japan | 257/335 |
| 1-39774 | 2/1989 | Japan | |

OTHER PUBLICATIONS

Chang et al, "Insulated Gate Bipolar Transistor (IGBT) with a Trench Gate Structure", IEDM 1987, pp. 674–677.
Temple et al. "MCT (MOS Controlled Thyristor) Reliability Investigation", IEDM 1988, pp. 618–621.
SIPMOS Process, Siemens Component Data Book, 1987/1988.
Dr. M. J. Humphreys, Philips Components, Hazel Grove, Stockport, Cheshire, U.K., "The Avalanche Ruggedness of Power MOSFETS", Electronique de Puissance, No. 38, pp. 18–25, Apr., 1990.
Love et al, IEEE Trans. Elect. Dev., ED-31,817 (1984).

Primary Examiner—Jerome Jackson
Assistant Examiner—Courtney A. Bowers
Attorney, Agent, or Firm—Ernestine C. Bartlett

[57] ABSTRACT

A semiconductor device of improved ruggedness is provided which comprises a semiconductor substrate having a region of a first conductivity type on a major surface thereof; a first base region of opposite conductivity type formed selectively within said regions of first conductivity type; a second base region of opposite conductivity type formed selectively within said first base region and having a higher impurity concentration than that of said first base region; a source region of one conductivity type formed within said first and second base regions and overlying said second base region; and a polysilicon gate electrode opposed to a channel region with a gate insulating layer interposed therebetween; wherein the second base region and the source region are formed substantially entirely within the first base region; the second base region is smaller in depth than the first base region and is formed at a distance sufficiently close to the channel region to effectively reduce parasitic resistance in the first base region, the lateral edges of the second base region being substantially aligned with the lateral edges of the gate electrode; the first base region and the source region are formed by sequential implantation through the polysilicon gate electrode region using the polysilicon gate electrode as a self-aligned mask, followed by implantation of the second base region without substantial lateral diffusion using the polysilicon gate electrode as a mask; and the polysilicon gate electrode is of a thickness sufficient to mask for selected depths of implantation in the first base region.

5 Claims, 5 Drawing Sheets

VERTICAL POWER MOS DEVICE WITH INCREASED RUGGEDNESS AND METHOD OF FABRICATION

FIELD OF THE INVENTION

This invention relates to an improved VDMOS power device, where the VDMOS identifies a vertical double diffused MOSFET device comprising a semiconductor element having source, body channel and drain regions of alternating conductivity disposed therein wherein the parasitic resistance value is reduced without degrading the breakdown voltage of the device.

BACKGROUND OF THE INVENTION

Vertical power DMOS (VDMOS) devices are currently used in the automotive industry to produce current smart power switches for applications such as automobile control circuits. In these applications, the most serious failure mode is destructive damage occurring during inductive switching, resulting from avalanche breakdown of the forward blocking junction in the presence of high current flow. A VDMOS device incorporates a semiconductor wafer in which source, body and drain regions of alternate conductivity type are disposed in series. The body region is disposed adjacent to a wafer surface, and the source and drain regions are located so as to define the length and width of a channel region in the body region at that surface. An insulated gate electrode is disposed on the wafer surface over the channel region.

During device operation, an appropriate voltage on the gate electrode inverts the conductivity type of the body region in that portion of the channel region that is contiguous with the wafer surface; so as to form an inversion channel contiguous with the wafer surface The remainder of the channel region comprises a depletion region which is associated with this inversion channel. For a particular device structure, the depth of the depletion region portion of the channel region is determined by the magnitude of the voltage applied to the gate electrode, and the inversion channel permits current flow between the source and drain regions. Thus, device operation is described as being unipolar in nature, with electron or hole flow being selectively modulated by an applied voltage to the gate.

Inherent in the source/body/drain structure of a VDMOS device is a parasitic NPN or PNP bipolar transistor the presence of which is detrimental to FET performance. With reference to FIGS. 1 to 6, there are illustrated devices 1 including a substrate 2 of a first conductivity type which constitutes or comprises the drain region 3 of high conductivity, an epitaxial layer 4 of n-polarity, a diffused layer 5 of opposite conductivity, preferably of p-polarity (referred to as the p-body region), multiple regions of opposite conductivity formed in the p-body region which function as the source region 6, a layer 7 of silicon dioxide, a layer 8 of polysilicon which forms the gate electrode, a layer 9 of deposited oxide (LTO), and a layer 10 of metal.

Susceptibility to breakdown is a phenomenon which limits the power handling capability of a bipolar transistor to below its full potential. In contrast, the power handling capability of a Power MOSFET is a simple function of thermal resistance and operating temperature since the transistor is not vulnerable to a second breakdown mechanism provided that the transistor is operated at or below its breakdown voltage rating $B_{VDSS}$ and is not subject to overvoltage. Should the transistor be forced into avalanche by a voltage surge, the structure of the transistor permits possible activation of a parasitic bipolar transistor which may then suffer the consequences of second breakdown. In the past this mechanism was typical of failure in circuits where the transistor becomes exposed to overvoltage. To reduce the risk of transistor failure during momentary overloads, improvements have been introduced to the Power MOS design which enable it to dissipate energy while operating in the avalanche condition. The term commonly used to describe this ability is "ruggedness". In devices as illustrated in FIGS. 1 to 6, for example, when such a device is in the off-state or operating in saturation, voltage is supported across the pn-junction. If the transistor is subjected to over-voltage (greater than the avalanche value of the transistor) the peak electric field, located at the pn junction, rises to the critical value at which avalanche multiplication commences. Computer modelling has shown that the maximum electric field occurs on the corner of the p-body. The electron-hole plasma generated by the avalanche process in this region gives rise to a source of electrons which are swept across the drain and a source of holes which flow through the p diffusion or p body regions towards the p+ contact. Clearly, the p region constitutes a resistance which will cause a potential drop beneath the n+ diffusion. If this resistance is too large, the pn-junction may become forward biased for relatively low avalanche currents. Also, if the manufacturing process does not yield a uniform cell structure across the transistor or if defects are present in the silicon, then multiplication may be a local event within the crystal. This would give rise to a high resistance beneath the source n+ region and cause a relatively large potential drop sufficient to forward bias the pn-junction and hence activate the parasitic npn bipolar transistor inherent in the MOSFET structure. Due to the positive temperature coefficient associated with a forward biased pn-junction, current crowding will rapidly ensue with the likely result of a second breakdown and eventual transistor destruction.

In order that a Power MOS transistor may survive transitory excursion into avalanche, it is necessary to manufacture a transistor with uniform cell structure, free from defects throughout the crystal, and within the cell, the resistance beneath the n+ region should be kept to a minimum. In this way a forward biasing potential across the pn-junction is avoided.

The term "ruggedness" when applied to a Power MOS transistor describes the ability of that device to dissipate energy while operating in the avalanche condition. To test the ruggedness of a transistor it is possible to use the method of unclamped inductive-load turn-off using a circuit wherein a pulse is applied to the gate such that the transistor turns on and load current ramps up according to the inductor value, L, and drain supply voltage, $V_{dd}$. At the end of the gate pulse, channel current in the Power MOS begins to fall while voltage on the drain terminal rises rapidly in accordance with equation (1).

$$\frac{dv}{dt} = \frac{d^2I}{dt} \qquad (1)$$

The voltage on the drain terminal is clamped by the avalanche voltage of the Power MOS for a duration equal to that necessary for dissipation of all energy stored in the inductor.

The energy stored in the inductor is given by equation (2), where $I_p$ is the peak load current at the point of turn-off of the transistor.

$$W_{Dss} = 0.5 L I_p^2 \quad (2)$$

All this energy is dissipated by the Power MOS while the transistor is in avalanche.

Provided the supply rail is kept below 50% of the avalanche voltage equation (2) approximates closely to the total energy dissipation by the transistor during turnoff. However a more exact expression which takes account of additional energy delivered from the power supply is given by equation (3).

$$W_{Dss} = BV_{Dss} \frac{0.5 L I_p^2}{BV_{Dss} - V_{DD}} \quad (3)$$

Clearly the energy dissipated is a function of both the inductor value and the load current $I_p$, the latter being set by the duration of the gate pulse. A 50 Ω resistor between gate and source is necessary to ensure a fast turn-off such that the transistor is forced into avalanche.

The performance of a non-rugged transistor in response to the avalanche test described above and much of the above technical background has been described in a private communication of Dr. M. J. Humphreys, Philips Components, Hazel Grove, Stockport, Cheshire, U.K. and is published in ELECTRONIQUE DE PUISSANCE, No. 38, pp. 18-25, April 1990. In such testing, it was found that the drain voltage rises to the avalanche value followed by an immediate collapse to approximately 30 V. This voltage is typical of the sustaining voltage during second breakdown of a bipolar transistor. The subsequent collapse to 0 V after 12 microseconds signifies failure of the transistor. One such transistor was only able to dissipate a few micro joules at a very low current in order to avoid a failure of this type.

Thus ruggedness is one of the important performance parameters of VDMOS power devices. As indicated above, in a typical device this parameter is limited by the parasitic resistance of the p-body under the source diffusion, i.e. the Ohmic resistance offered by the device under conductive conditions.

In prior art VDMOS power device structures as illustrated in FIGS. 1 to 6, region 6 is the source, region 11 is the channel, and region 3 is the drain region. The parasitic resistance under the source diffusion determines the ruggedness of the device as measured by the total inductive energy that can be absorbed by the device in the avalanche condition. The device is damaged when the parasitic npn bipolar transistor is turned on by the voltage drop across the resistor R caused by hole current from avalanche breakdown of the p-body/n-drain junction. Therefore, improving the ruggedness of the device can be accomplished by reducing the resistance R such that, higher avalanche hole current is required to turn on the bipolar device. This in turn can be accomplished by providing increased amounts of p-type dopant (boron for example) in the p-body region. However, the same p-body concentration under the gate region determines the threshold voltage of the device and cannot be increased beyond about 2.5 volts, without adversely affecting the device performance. This places an upper limit on the p-body concentration or a lower limit on the parasitic resistance. To surpass this limit, an approach used in the prior art consists of adding another p-type diffusion and a tapered poly gate (shown in FIG. 4). The same constraints on threshold voltage apply here also, thereby again limiting the parasitic resistance value. Furthermore, this approach results in a deeper p-region which degrades the breakdown voltage of the device. Additionally, the tapered polysilicon gate profile needed in this approach makes the process more complex.

Another prior art approach involves the implantation of another p-type layer, defined by a mask with an opening centered between the poly gate edges. (See FIGS. 5 and 6). This implanted layer is then diffused deep vertically and laterally to reduce the parasitic resistance. Again the same limitation on the threshold voltage limits the value of the resistance. Furthermore, the deep p-type diffusion degrades the breakdown voltage. Additionally, this technique needs an extra mask thereby increasing the overall complexity of the manufacturing process.

The prior art methods thus use techniques that involve deep p+ diffusion with a deep junction depth through the use of implantation masks which independently define the heavy boron doping away from the polysilicon gate. This not only expands inner cell dimensions, it also fails to effectively reduce p-body resistance.

In general, prior art devices and techniques may be grouped in several categories: the standard VDMOS without p+ diffusion, non-self aligned p+ diffusion, and self-aligned p+ diffusion techniques and resultant devices.

The standard VDMOS without p+ diffusion is suggested;

Love et al, IEEE Trans. Elect. Dev., ED-31,817 (1984).

Non-self-aligned p+ diffusion techniques and devices are illustrated by the following references:

Goodman et al, U.S. Pat. No. 4,587,713, May 13, 1986
Nakaqawa et al, U.S. Pat. No. 4,680,604, Jul. 14, 1987
Suzuki et al, EPO 336,393 (Europe), Oct. 11, 1989
Chang et al, *Insulated Gate Bipolar Transistor (IGBT) With a Trench Gate Structure*, IEDM 1987, pp. 674-677;
Temple et al, *MCT (MOS Controlled Thyristor) Reliability Investigation*, IEDM 1988, pp. 618-621; and
SIPMOS Process, Siemens Component Data Book, 1987/1988.

In all of such p+ diffusion techniques and devices as described in these references, the low resistance p+ diffusion is formed using a photoresist mask and is therefore a non-self-aligned method. When the fabrication method is not self-aligned, cell dimensions are increased thereby increasing the effective cost of the device. Additionally although such methods improve the ruggedness of the device, they cannot be used to produce the high density device that forms the subject of this investigation. This type of non-self-aligned method and device is referred to below as the conventional method and device.

Prior art self-aligned p+ diffusion techniques and devices are illustrated by the following references:

Goodman et al, U.S. Pat. No. 4,587,713, May 13, 1986
Contiero et al, U.S. Pat. No. 4,774,198, Sep. 27, 1988
Temple et al, U.S. Pat. No. 4,809,047, Feb. 28, 1989

Yasukazu, Abstract of JP application 62-196917 (Japan), Feb. 10, 1989.

In the techniques and devices represented by such references, although the low resistant p+ diffusion region is formed by a self-aligning technique, the devices are still deficient. For example, in the Contriero and Temple et al patents, p+ implantation is done using either oxide spacers at the polysilicon step or oxide grown around the polysilicon. Similarly, in Yasukazu, the implantation mask is a deposited oxide having $3\mu$ eaves from the polysilicon gate. In each such procedure, the p+ diffusion cannot be formed close enough to the channel to effectively reduce resistance in the p-body. Furthermore, the additional $3\mu$ ring or rectangular dimension added in such techniques as illustrated by Yasukazu expands cell size by the same amount making it large. The oxide spacers or surrounding oxides of the Contiero et al and Temple et al devices generate similar results.

SUMMARY OF THE INVENTION

An object of the present invention is the provision of a device and method which reduces the parasitic resistance without degrading the breakdown voltage or affecting the threshold voltage of the device and without the necessary use of oxide eaves or spacers or surrounding oxide.

Another object of the invention is to provide an improved VDMOS device with increased ruggedness and high density.

These and other objects are obtained in a semiconductor device comprising a semiconductor substrate which constitutes or comprises entirely or partially a drain region 30; an epitaxially grown layer 40, preferably a layer of n-monocrystalline silicon of high resistivity present on said substrate; a plurality of source regions doped with an impurity of first type of conductivity, formed in the top portion of said epitaxially grown layer, preferably arsenic atoms implanted to form n+ source regions 60; a body region, formed by moderately doping with an impurity of a second type of conductivity and diffusion, preferably with boron atoms implanted to form a p-body region 50; a gate electrode of polycrystalline silicon 80 formed on the surface of said epitaxially grown layer previously covered with an insulating gate oxide 70 between adjacent body regions and superimposed to edges of said body regions; a region of heavy doping with an impurity of the second conductivity type entirely contained inside each of said body regions and whose perimeter coincides substantially with the perimeter of said gate electrode preferably boron atoms implanted and activated to form a p+ diffused region 140, said heavy doping region with impurity of the second conductivity type being implanted under conditions such that the region is between the source and p-body regions, said source region, p-body region and heavy doping p+ diffused region being formed by implantation performed through the polysilicon gate without substantial lateral diffusion using the self-aligned polysilicon gate as a mask.

In accordance with the invention, there is also provided a method for producing a semiconductor device, preferably a VDMOS device, of improved ruggedness and cell density comprising the steps of:

(1) providing an epitaxial layer 40 on a substrate 30, preferably an n-type epi layer grown on an n++ substrate;

(2) forming a gate 80, preferably a polysilicon gate on said epi layer with gate oxide on its surface, and, using said gate as a mask, successively (a) forming a self-aligned body region doped with an impurity of a second conductivity type, preferably a body region moderately doped with an impurity of a p-type conductivity in said epi layer;

(b) applying a mask to the center portion of said p-body region;

(c) forming a plurality of self-aligned source regions 60 doped and diffused with an impurity of a first conductivity type; preferably regions heavily doped with impurities of a n+-type conductivity in said body region after which the mask is removed; and (d) forming by high energy implantation and activation, a self-aligned region 140 of doping with an impurity of the second conductivity type, preferably heavily doped with an impurity of a p+ conductivity substantially entirely contained within said self-aligned body region;

said gate being of a thickness sufficient to mask for selected depths of implantation in said p-body region.

By the present invention, it is possible to reduce the parasitic resistance without degrading the breakdown voltage or affecting the threshold voltage of the device and without the necessary use of oxide eaves or spacers or surrounding oxide.

This technique can reduce the parasitic resistance value by more than a factor of 10 compared to existing techniques.

According to the invention, a self-aligned technique is employed that results in a factor of 8 to 10 improvement compared to the prior art.

Also according to the invention, a relatively thick polysilicon step is repeatedly used to generate various components of the device such as the p-body, n+ source and p+ regions producing increased ruggedness in a VDMOS with high cell density. The result is a structure of precise dimensions in which the source junction depth is shallower and wherein high concentrations of p+ diffusion under the channel are eliminated while at the same time the horizontal dimensions of p+ diffusions close to the channel are maintained. A vertical poly gate device is used and a separate high dose p-type layer is implanted in the source regions using the poly gate as the self aligned mask. The energy and the dose are chosen such that the p-type dopant (boron for example) has a peak below the n+-source diffusion. A two-dimensional simulated profile was done using a computer simulation and is shown in FIG. 8. Typical doses and implant energies are $1-7 \times 10^{15}$ and 100–400 KEV respectively. After implanting the p-type layer, the dopant activation temperature and times are adjusted such that the heavily doped p-type layer does not encroach the channel region (typically but not exclusively, the temperature and time used are 900° C. and 15 minutes). In this way, the threshold voltage is not affected, the parasitic resistance is reduced by at least 10 times compared to the prior art, and other electrical parameters of the device are not changed. A spreading resistance profile of the source region of devices fabricated according to the invention is shown in FIG. 9 where, for example, the peak p-type concentration below the n-source regions is around $2 \times 10^{19}$. In this embodiment, the parasitic resistance value has been reduced substantially, resulting in ruggedness improvement by a factor of 8 to 10 compared to the best results of the prior art. Experimental values of ruggedness on two prior art devices and the present invention are shown in the Table discussed further hereinbelow.

DETAILED DESCRIPTION OF PREFERRED EMBODIMENTS

Figure 6:
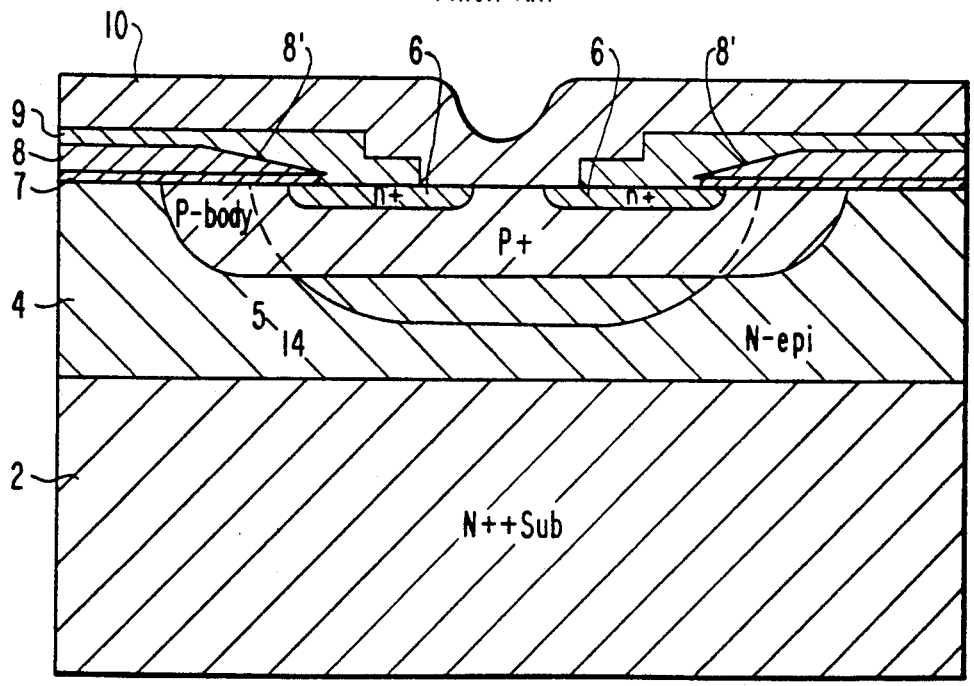
FIG. 6 is a schematic sectional view of another prior art VDMOS device.
Figure 7:
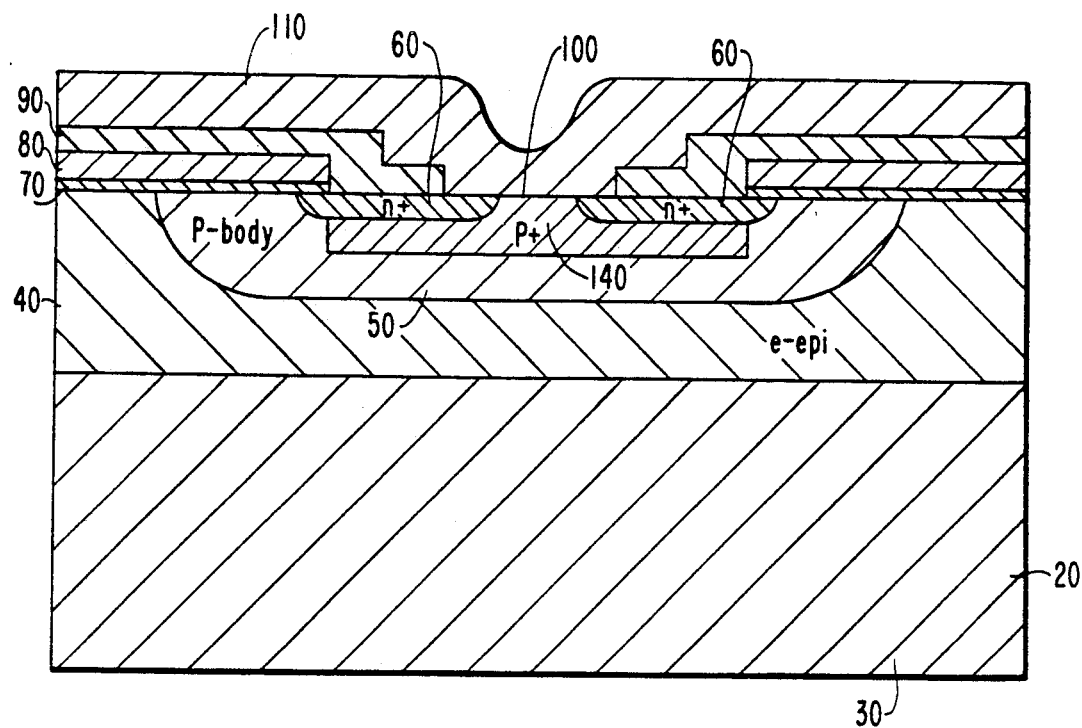
FIG. 7 is a schematic sectional view illustrating a VDMOS power device of this invention.
Figure 8:
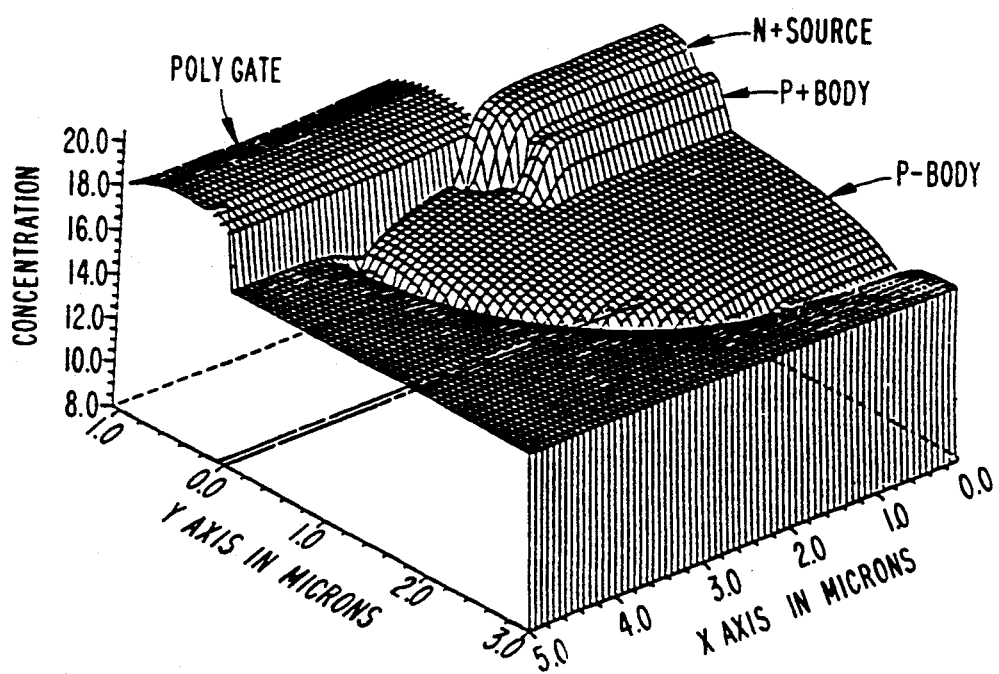
FIG. 8 is an illustration of a two-dimensional computer process simulation near the channel region of a VDMOS power device of this invention.

With reference to FIGS. 6-8, there is illustrated a device according to the invention in which the polysilicon gate edge is vertical and it is used to mask a high energy p+ implantation (for example, boron) to define the p+ region after the p-body and n+ source region formation. The high energy implantation enables boron to go through the n+ source layer without any lateral diffusion.

Figure 1:
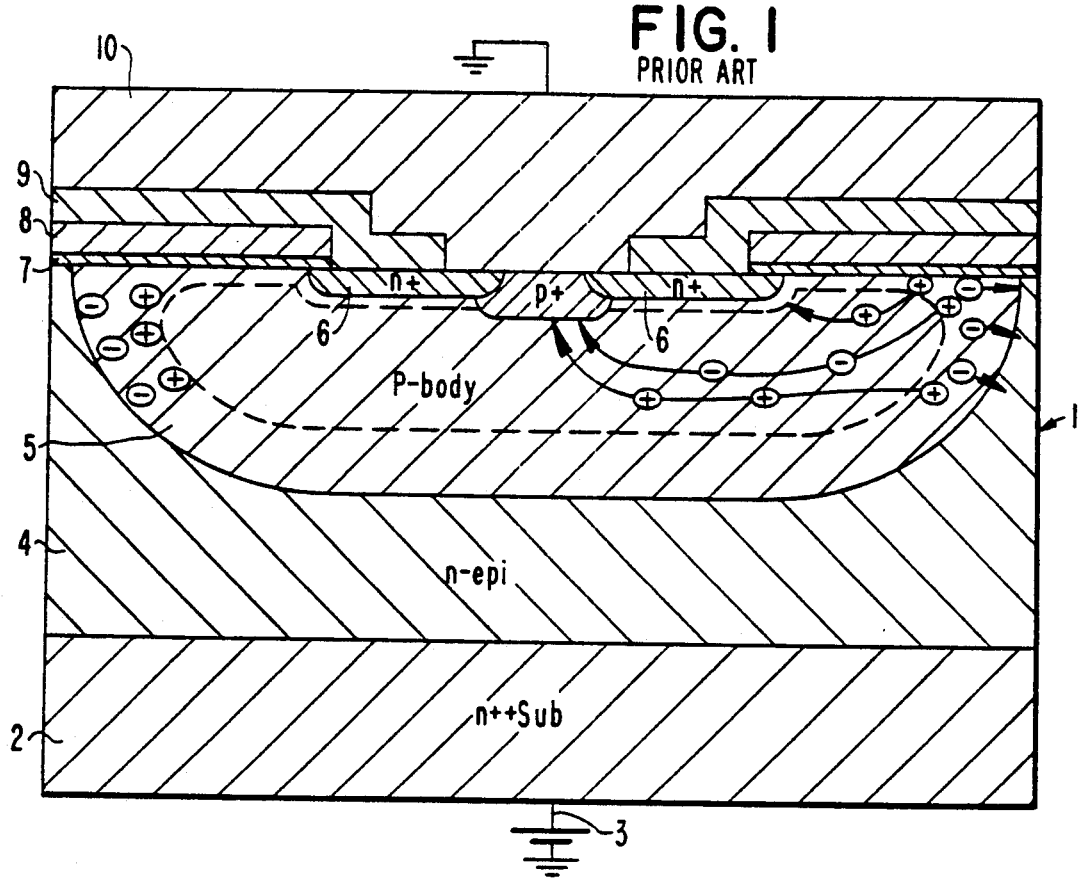
FIG. 1 is a schematic sectional view of a VDMOS power device illustrating carrier motion and avalanche mode.
Figure 2:
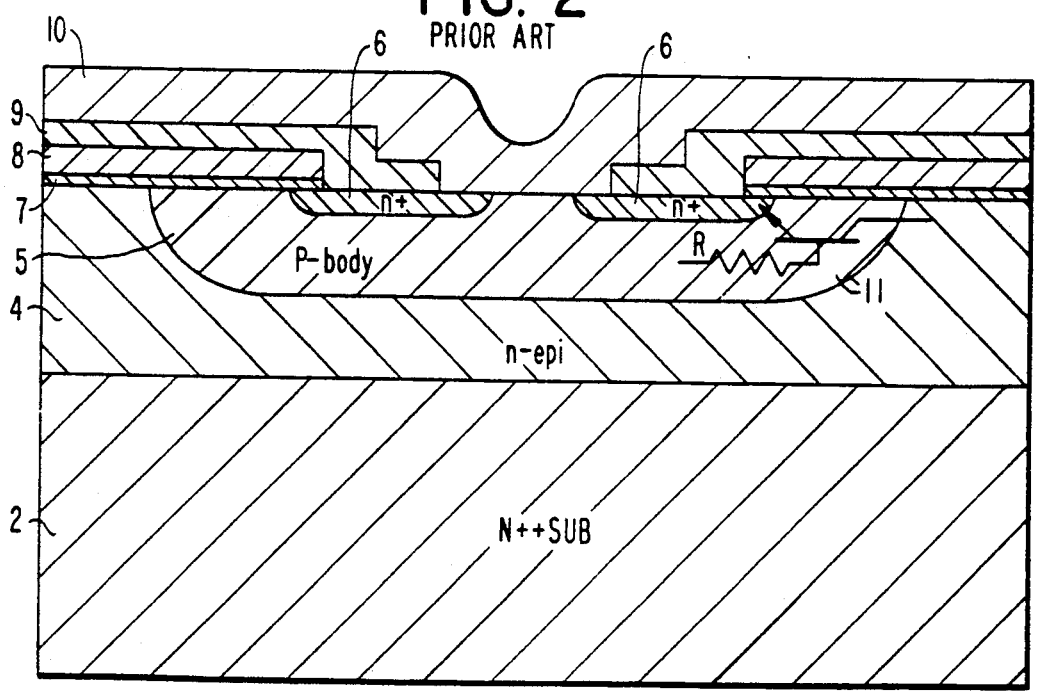
FIG. 2 is a schematic sectional view of a prior art VDMOS power device.
Figure 3:
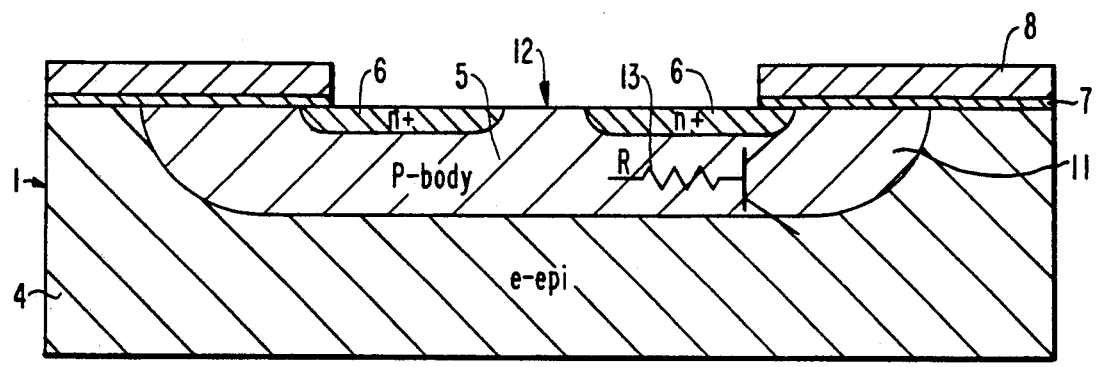
FIG. 3 is a schematic sectional view of another prior art VDMOS power device.
Figure 4:
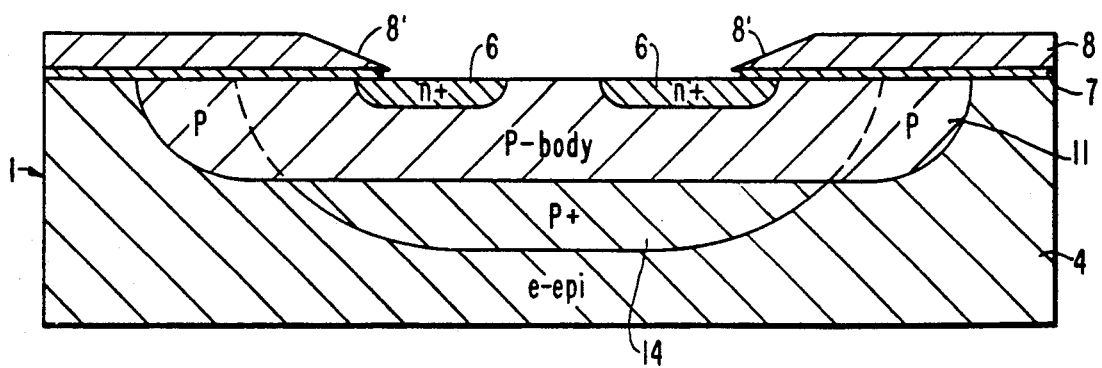
FIG. 4 is a schematic sectional view of another prior art VDMOS power device.
Figure 5:
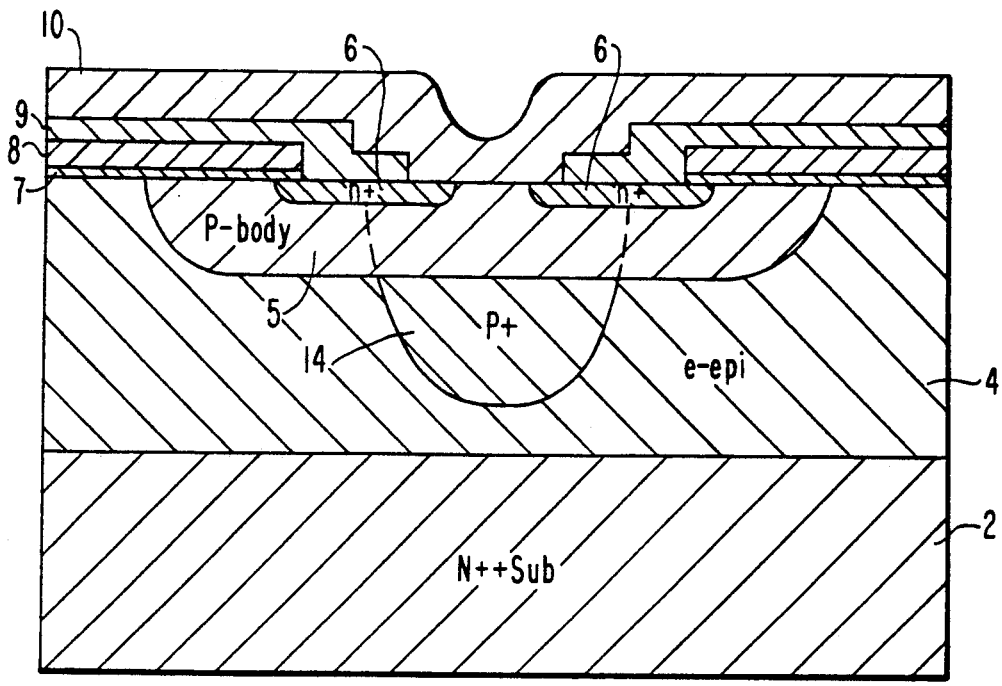
FIG. 5 is a schematic sectional view of another prior art VDMOS power device.

In contrast, the prior art device in FIGS. 4 and 6 employ a deep p+ diffusion and a tapered polysilicon gate in addition to the p-body and n+ diffusions. The processing sequence used to accomplish this results in a deep p+ diffusion as indicated in the figure. The p+ diffusion is carried out prior to the definition of the p-body thereby distributing high boron concentration in the channel region and increasing the threshold voltage. In order to maintain a reasonable threshold voltage the p+ doping must be restricted, reducing the ruggedness effect. The tapered polysilicon gate results in an additional restriction because of the threshold voltage requirement. Moreover, the tapered poly gate of the prior art device is not capable of masking the high energy boron in the tapered region to prevent the boron from ending up in the channel. The present invention results in a more rugged device as explained hereinabove. In the devices illustrated, the layer 9 and 90 is a low temperature oxide for example, as obtained in a 450° C. CVD process step. This layer is essential in isolating the gate polysilicon from the source metal. Other dielectric layers (oxide or nitride) may be used to accomplish this same result as long as the deposition temperature is below 800° C. so as not to disturb the p+ profile. All the prior art devices under discussion herein also require some form of isolation between the polysilicon gate and the source metal; however, for ease of elucidation this is not shown in FIGS. 3 and 4.

Figure 9:
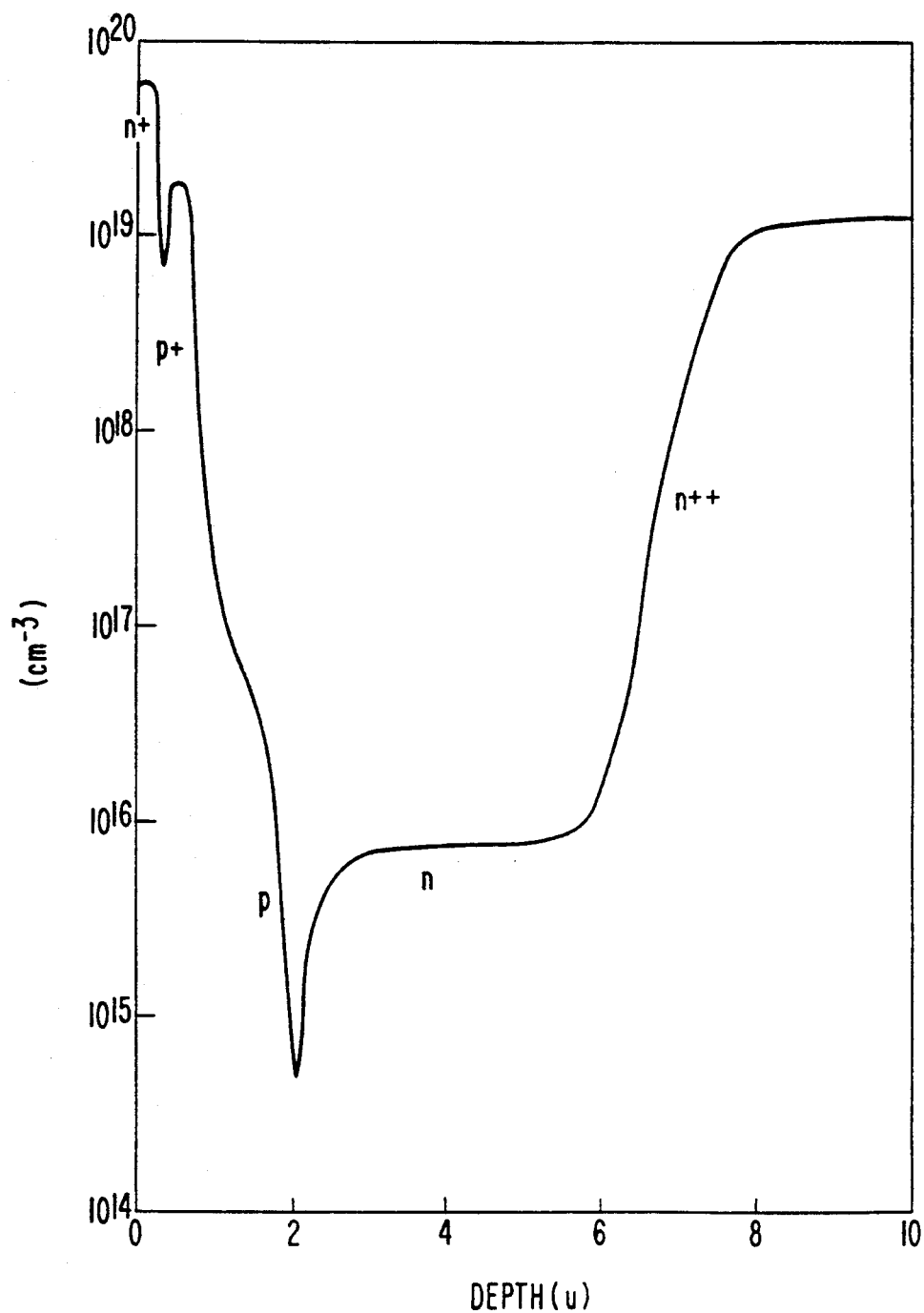
FIG. 9 is a graph illustrating the spreading resistance profile of a VDMOS power device of this invention.

To illustrate the invention, with reference to FIGS. 7-9, a 10A VDMOS with breakdown voltage in excess of 60 V was fabricated, tested and compared with other devices. It will be seen that such a device of the invention comprises a semiconductor substrate which constitutes or comprises entirely or partially a drain region 30; an epitaxially grown layer 40 preferably a layer of n− monocrystalline silicon of high resistivity present on said substrate; a plurality of source regions doped with an impurity of first type of conductivity, formed in the top portion of said epitaxially grown layer, preferably arsenic atoms implanted to form n+ source regions 60; a body region, formed by moderately doping with an impurity of a second type of conductivity and diffusion, preferably with boron atoms implanted to form a p-body region 50; a gate electrode of polycrystalline silicon 80 formed on the surface of said epitaxially grown layer previously covered with an insulating gate oxide 70 between adjacent body regions and superimposed to edges of said body regions; a region of heavy doping with an impurity of the second conductivity type entirely contained inside each of said body regions and whose perimeter coincides substantially with the perimeter of said gate electrode preferably boron atoms implanted and activated to form a p+ diffused region 140, said heavy doping region with impurity of the second conductivity type being implanted under conditions such that the region is between the source and p-body regions, said source region, p-body region and heavy being formed by implantation performed through the polysilicon gate using the polysilicon gate as a self-aligned mask, after which the heavy doping p+ diffused region is implanted without substantial lateral diffusion using the self-aligned polysilicon gate as a mask.

In accordance with the invention, there is also provided a method for producing a semiconductor device, preferably a VDMOS device, of improved ruggedness and cell density comprising the steps of:

(1) providing an epitaxial layer 40 on a substrate 30, preferably an n-type epi layer grown on an n++ substrate;

(2) forming a gate 80, preferably a polysilicon gate on said epi layer and, using said gate as a mask, successively (a) forming a self-aligned body region doped with an impurity of a second conductivity type, preferably a body region moderately doped with an impurity of a p-type conductivity in said epi layer;

(b) applying a mask to the center portion of said p-body region;

(c) forming a plurality of self-aligned source regions 60 doped with an impurity of a first conductivity type; preferably regions lightly doped with impurities of a n+ − type conductivity in said body region after which the mask is removed; and (d) forming by high energy implantation and activation, a self-aligned region 140 of doping with an impurity of the second conductivity type, preferably heavily doped with an impurity of a p+ conductivity substantially entirely contained within said self-aligned body region;

said gate being of a thickness sufficient to mask for selected depths of implantation in said p-body region. The 10A VDMOS with breakdown voltage in excess of 60 V fabricated with the method of this invention showed much higher power dissipation capability and superior ruggedness when compared with other devices available in the industry. The VDMOS of the invention illustrated in FIGS. 7-9 was designed with a rectangular cell shape. The cell pitch varied from 7.0 μm to 20.0 μm in order to optimize the pitch for the desired on-resistance and ruggedness. The starting material was a $8e^{15}/cm^3$ N-type epi layer grown on a 0.003 Ω-cm N++ substrate with (100) orientation. The major processing steps are (1) deep-P diffusion for the edge termination; (2) local oxidation of the silicon body, i.e. LOCOS, outside of the active are a; (3) gate oxidation; (4) poly gate formation; (5) self-aligned P-body implantation and a long drive-in; (6) self-aligned N+ source implantation and a short drive-in; (7) self-aligned high energy P+ implantation into the p-body to lie below the N+ source with follow-up activation; (8) interlevel dielectrics formation; (9) source contact; and (10) metallization.

The VDMOS fabricated using the above method was tested for ruggedness in order to determine the safe operating range. The peak current density, $J_{peak}$, avalanche breakdown voltage, $V_{av}$, peak power, $P_{peak}$, and peak energy dissipated, $E_{peak}$ are presented in the following Table for comparison with two other device types.

TABLE
RUGGEDNESS COMPARISON

| Process Types (chip size) | Parameter | Ave. | Min. | Max. | Ratio | Unit |
|---|---|---|---|---|---|---|
| Derived By | Ipeak | 295.5 | 257 | 325 | 1 | mA/mm² |
| Conventional | Vav | 80.5 | 60 | 89 | 1 | Volt |
| Process | Ppeak | 22.8 | 18 | 29 | 1 | W/mm² |
| (1.0 mm²) | Epeak | 2.07 | 1.6 | 2.7 | 1 | mJ/mm² |
| Derived By | Ipeak | 549.7 | 475.5 | 623.8 | 1.86 | mA/mm² |
| Tapered Poly | Vav | 64.5 | 47 | 82 | 0.80 | Volt |
| Gate | Ppeak | 36.0 | 36 | 36 | 1.58 | W/mm² |
| (0.358 mm²) | Epeak | 4.55 | 2.8 | 6.3 | 2.19 | mJ/mm² |
| Derived By | Ipeak | 927.8 | 883 | 948 | 3.14 | mA/mm² |
| The Method of | Vav | 61.0 | 51 | 67 | 0.76 | Volt |
| this invention | Ppeak | 57.5 | 48 | 64 | 2.52 | W/mm² |
| (1.0 mm²) | Epeak | 38.45 | 36.5 | 40.5 | 18.57 | mJ/mm² |

In the Table, $E_{peak}$ is the peak energy dissipated before the device fails;

$V_{av}$ is the average voltage;

$P_{peak}$ is the peak power; and $I_{peak}$ is the current according to the formula $P = VI^2$ In the Table, the designation "conventional process" represents the standard VDMOS without p+ diffusion, whereas the designation "tapered poly gate" represents a conventional p+ diffusion process. In the latter case, the tapered poly helps reduce the boron concentration in the channel compared to the old diffusion method with vertical poly. However, it is difficult to avoid an increase of threshold voltage in either method because of an additional doping of boron into the channel. According to the invention, the boron introduced in the P+ implantation remains under the source and does not disturb the channel concentration profile as shown in FIGS. 7-9. A large reduction in P-body resistance is possible, thereby improving the ruggedness, without having an adverse effect on the threshold voltage and other device parameters. The $J_{peak}$, $P_{peak}$, and $E_{peak}$ values are significantly improved when compared with devices obtained with the prior art processes. The $E_{peak}$ is 18 times that of the conventional device and about 6 times that of the tapered poly gate. The high $J_{peak}$ capability makes this VDMOS more reliable as a high current power device and extends the safe operating range.

It will be understood that the process parameters may vary over a wide range and still be operable herein.

For example, the poly gate thickness may vary as desired as long as it is sufficient to permit selected implantation and diffusion at the depth desired within the body. Preferably, thicknesses from about 0.3 to 2 microns are contemplated. A thickness above about 2 microns is presently impractical because it creates step coverage problems.

Additionally, the energy level required for the p+ implantation may be changed in accordance with the poly gate thickness. Preferably, the implantation will be performed at energy levels varying from 20K to 400KEV. Similarly, the p+ dopant activation temperature and times after implantation may vary as desired.

While the invention has been described in terms of an N channel VDMOS device, it will be understood that the conductivity type of all regions can be reversed to produce P channel VDMOS device.

In an especially preferred embodiment of the invention, the substrate may be one having a region n++ of very high concentration obtained by special doping with high solubility or by industrial standard antimony. Additionally the method may include the steps of:

a) forming the p-body region by high energy implantation with a long drive-in;

b) forming the n+ source region by implanting with an appropriate mask at the contact area with drive-in, c) removing the mask;

d) forming the p+ diffused region by high energy implantation; and e) heating the substrate to a temperature of about 900° C. for about 15 minutes to activate the p+ diffusion, the p-body and p+ diffusion regions being formed using the polysilicon gate as a mask.

I claim:

1. A semiconductor device of improved ruggedness which comprises:

a semiconductor substrate having a region of a first conductivity type on a major surface thereof;

a first base region of opposite conductivity type formed selectively within said region of first conductivity type;

a second base region of opposite conductivity type formed selectively within said first base region and having a higher impurity concentration than that of said first base region;

a source region of one conductivity type formed within said first and second base regions and overlying said second base region; and a polysilicon gate electrode opposed to a channel region with a gate insulating layer interposed therebetween;

wherein:

the second base region and the source region are formed substantially entirely within the first base region;

the second base region is smaller in depth than the first base region and is formed at a distance sufficiently close to the channel region to effectively reduce parasitic resistance in the first base region, the lateral edges of the second base region being substantially aligned with the lateral edges of the gate electrode;

the first base region and the source region are formed by sequential implantation through the polysilicon gate electrode region using the polysilicon gate electrode as a self-aligned mask, followed by implantation of the second base region without substantial lateral diffusion using the polysilicon gate electrode as a mask; and the polysilicon gate electrode is of a thickness sufficient to mask for selected depths of implantation in the first base region.

2. A semiconductor device as claimed in claim 1 wherein said region of first conductivity is an N− type monocrystalline silicon epitaxial layer and said semiconductor substrate is a heavily doped n+ substrate; said first region is a p-body region; said source region is a n+ region, and said second base region is a p+ diffused region.

3. A semiconductor device of improved ruggedness which comprises:
- an N-type monocrystalline silicon epitaxial layer grown on a major surface of a heavily doped n+ substrate;
- a boron-doped p-body region formed selectively within said epitaxial layer;
- a heavily boron-doped p+ −diffused second base region formed selectively within the p-body region;
- an arsenic doped n+ source region formed within the p-body and p+ −diffusion regions and overlying the p+ −diffusion region; and
- a polysilicon gate electrode on said epitaxial layer and opposed to a channel region with a gate insulating layer interposed therebetween;

wherein:
- the p+ −diffused region and the n+ source region are formed substantially entirely within the p-body region;
- the p+ −diffused region is smaller in depth than the p-body region and is formed at a distance sufficiently close to the channel region to effectively reduce parasitic resistance in the p-body region, and has lateral edges that are substantially aligned with the lateral edges of the gate electrode;
- the p-body region and the n+ source region are formed by sequential implantation through the polysilicon gate electrode region with lateral diffusion using the polysilicon electrode as a self-aligned mask, followed by implantation of the p+ diffused base without substantial lateral diffusion using the polysilicon gate electrode as a mask; and
- the polysilicon gate electrode is of a thickness sufficient to mask for selected depths of implantation in the p-body region.

4. A semiconductor device as claimed in claim 3 wherein the p+ −diffusion region is formed by implantation of a 1−7×10e15 dose of boron at 100−400 KEV.

5. A semiconductor device as claimed in claim 4 wherein said heavily doped p+ implantation is heated at a temperature of about 900° C. for about 15 minutes.

* * * * *